United States Patent [19]

Ormond

[11] Patent Number: 4,764,752
[45] Date of Patent: Aug. 16, 1988

[54] ANALOG TO DIGITAL CONVERTER HAVING NO ZERO OR SPAN DRIFT

[76] Inventor: Alfred N. Ormond, 4010 Hermitage Dr., Hacienda Heights, Calif. 91745

[21] Appl. No.: 61,730

[22] Filed: Jun. 15, 1987

[51] Int. Cl.[4] .............................................. H03M 1/06
[52] U.S. Cl. .............................. 340/347 NT; 328/127; 340/347 AD
[58] Field of Search ................. 328/127; 340/347 NT, 340/347 AD

[56] References Cited

U.S. PATENT DOCUMENTS 4,361,811 11/1982 Ormond ............................... 328/127

*Primary Examiner*—William M. Shoop, Jr.
*Assistant Examiner*—Richard K. Blum
*Attorney, Agent, or Firm*—Freilich, Hornbaker, Rosen & Fernandez

[57] ABSTRACT

This invention relates to an analog to digital convertor in which zero drift and span drift are eliminated. The first differential amplifier has inputs of an analog voltage which can be switched between its positive input terminals in polarity and a reference voltage which can be switched between its negative input terminals. The output of the summing amplifier is integrated in a positive differential integrator, preferably, and fed through a crossover detector to detect crossover of the signals from the two sides of the integrator. Integration is carried out while adding the reference voltage and the analog voltage over a first fixed time period. The reference voltage is then reversed over a second time period to perform a first conversion. The start and stop signals of these time periods are used to start and stop a pulse counter. A second conversion is carried out by subtracting the analog voltage from the reference voltage and then reversing the reference voltage after said fixed time period until crossover occurs, defining third and fourth periods over which the counter counts the pulses. These define the counts $N_0$, $N_2$, $N_0$ and $N_4$. $N_2-N_0$ is then divided by $N_2+N_0$ to obtain a signal proportional to the analog voltage having no span drift. $N_0-N_4$ can then be divided by $N_0+N_4$ to obtain a signal proportional the analog voltage having no span drift. These two signals can be added together to obtain a signal proportional to the analog voltage having no span or zero drift.

13 Claims, 4 Drawing Sheets

ANALOG TO DIGITAL CONVERTER HAVING NO ZERO OR SPAN DRIFT

This invention relates to an analog to digital converter and more particularly to an improved analog to digital convertor in which zero drift and span drift are eliminated.

BACKGROUND OF THE INVENTION

Conventional dual slope integrator analog to digital converters are generally preferred where low voltage input signals are to be measured. The dual slope technique provides excellent noise rejection and an accuracy that in general is independent of the clock pulse rate and integrating resistors and capacitors. However, such known circuits have a first order of sensitivity to zero drift and second order of sensitivity to span error with temperature. Further, it is generally difficult to obtain bipolar operation using conventional known techniques. In its practical form, the accuracy of an analog to digital convertor depends upon the following characteristics of the basic circuit:

1. Offset voltage of the pre-amplifier or buffer, integrator and crossover detector.
2. Offset voltage drift of the pre-amplifier or buffer, integrator and crossover detector.
3. Dynamics of the switches, capacitors, pre-amplifier, integrator and crossover detector.
4. Discontinuities at or near zero signal associated with achieving bipolar signal conversion.
5. Internal circuit noise.
6. Linearity of the amplifier, integrator and crossover detector.

Any analog to digital conversion circuit which would provide for improvement in the foregoing characteristics would be highly desirable.

In my U.S. Pat. No. 4,107,618, there is described an operational differential amplifier system wherein the signal gain of an input analog signal can be made independent of a reference voltage. The technique described in this patent can be used to advantage in the provision of a greatly improved analog to digital convertor wherein zero drift is essentially eliminated.

In U.S. Pat. Nos. 4,608,553 and 4,390,864, there is described an analog to digital convertor without zero or span drift employing a technique using fixed slope, variable amplitude analog to digital conversion.

BRIEF DESCRIPTION OF THE PRESENT INVENTION

With the foregoing in mind, the present invention provides such an improved analog to digital convertor without zero drift and preferably span drift due to temperature is also eliminated. The present invention uses a variable amplitude fixed time period A to D convertor.

Briefly, in accord with the basic method of the present invention, an analog signal is converted to a numerical count directly proportional to the signal without zero drift or span drift, by utilizing a reference voltage in a circuit portion similar to that described in my aforementioned U.S. Pat. No. 4,107,618. A first conversion is affected in accordance with the following steps:

First, the differential operational amplifier means is used for adding the analog signal to the reference voltage for a fixed period of time. A series of clock pulses is generated and a counter is provided for the clock pulses. The counter is caused to start and stop at the beginning and end of the fixed time period, to define a first given number $N_0$ of pulses. The reference voltage is then reversed in polarity until a time when the two signals cross over, defining a second time period $N_2$, over which the counter counts the clock pulses. A microprocessor then divides $N_2 - N_0$ by $N_2 + N_0$ to obtain a signal proportional to the analog voltage and having no span drift.

In a second conversion, the polarity of the analog signal is reversed and the reference signal is first added to it and then subtracted to define third and fourth time periods, the first one being fixed, again with $N_0$ pulses, and the second one defined by the time of return to the crossover and including $N_4$ pulses. The microprocessor then divides $N_0 - N_4$ by $N_0 + N_4$ to obtain a signal proportional to the analog voltage and having no span drift.

The two foregoing signals may be added to provide a signal $$\frac{N_2 - N_0}{N_2 + N_0} + \frac{N_0 - N_4}{N_0 + N_4} = \frac{2e_i}{V_R}$$

which is a signal proportional to the analog voltage and having no span and no zero drift.

Substantial improvement is thus provided in the first four characteristics described, and some improvement is also shown for the last two characteristics.

It is an object of the present invention to integrate after the pre-amplifier so noise in the pre-amplifier is eliminated.

Another object is to eliminate zero and span drift.

Still another object is to provide a circuit in which everything is symmetrical and nothing is referred to ground so you have no ground noise and no reference voltage to the power supply.

Still another object is to provide a positive differential integrator which is not referenced to ground and so reduces noise.

BRIEF DESCRIPTION OF THE DRAWINGS

A better understanding of this invention as well as further features and advantages thereof will be had by referring to the accompanying drawings in which.

DETAILED DESCRIPTION OF THE INVENTION

Figure 1:
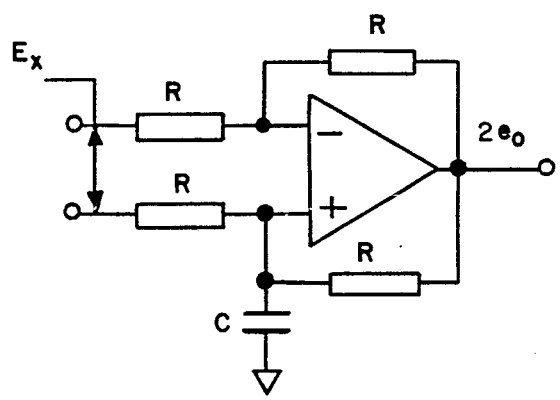
FIG. 1 is a circuit diagram partly in block form of a positive integrator.
Figure 2:
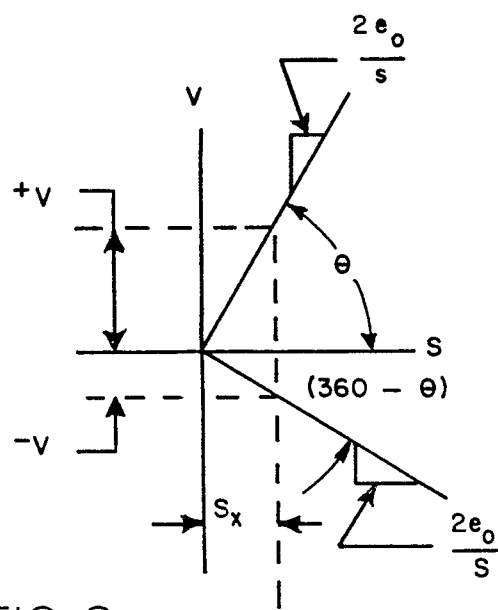
FIG. 2 is a graph indicating the integrator slope with terminology.

The following nomenclature is used in connection with all figures:

TAN $\theta$ = Slope of integrator
$e_0$ = Output of integrator
$S_x$ = Conversion period time in seconds
$V_x$ = Variable Amplitude of integrator
$V_B$ = Strain gauge bridge power supply voltage
RC = Integrator (Resistance—Capacitance) Constant
$N_x$ = Number of counts in period $S_x$
f = Oscillator frequency
$E_x$ = Input voltage to the integrator
$e_i$ = Analog signal to be measured
$V_R$ = Reference Voltage
$G_x$ = Amplifier gain (Ratio of Resistors)
$V_t = (V_o + V_C)$ = Bias voltage and bias voltage drift, including the integrator, with respect to time and temperature
s = Unit time
k = Calibration factor Referring now to FIGS. 1 and 2, the following derivation can be made:

$N_o$ = Fixed number of counts = $S_o f$ by definition $$\text{TAN } \theta_x = \frac{2e_0}{s} = \frac{E_x}{RC} = \frac{V_x}{S_x} \text{ (Pos. Slope)} \quad \text{(eq. 1)}$$

$$\text{TAN }(360 - \theta_x) = \frac{-2e_0}{s} = \frac{-E_x}{RC} = \frac{-V_x}{S_x} \text{ (Neg. Slope)}$$

When the time interval $(S_X)$ is measured with a counter $$S_x = \frac{N_x}{f}$$

Then by equality $$2e_{0x} = V_x = \frac{E_x S_x}{RC} = \frac{E_x N_x}{RCf} \quad \text{(eq. 2)}$$

$E_x$ may include various unknown quantities such as $E_I$ and $V_t$. Also, $E_x$ may include known values such as $V_R$. $N_x$ can be solved for one unknown quantity for each conversion period (phase) where $E_x$ is composed of different variables or for the unknown quantity $(V_x RCf)$.

Solving equation 2 for Nx $$\frac{1}{N_x} = \frac{E_x}{V_x RCf} \text{ Ref. FIG. C-2} \quad \text{(eq. 3)}$$

Then $$\frac{1}{N_1} = \frac{1}{N_0} = \frac{E_1}{V_1 RCf} \text{ (First Phase)}$$

$$\frac{1}{N_2} = \frac{E_2}{(-V_1 RCf)} \text{ (Second Phase)}$$

$$\frac{1}{N_3} = \frac{1}{N_0} = \frac{E_3}{V_2 RCf} \text{ (Third Phase)}$$

$$\frac{1}{N_4} = \frac{E_4}{(-V_2 RCf)} \text{ (Fourth Phase)}$$

Figure 4:
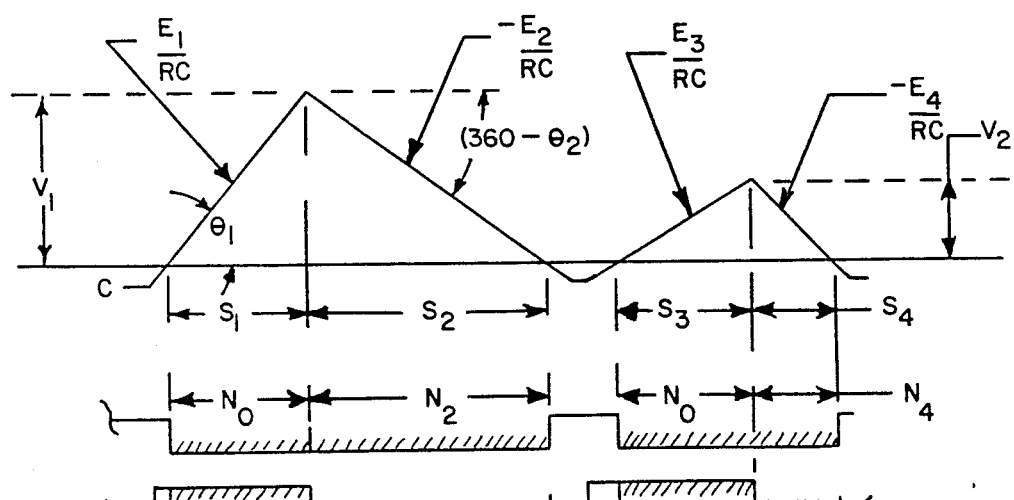
FIG. 4 is a series of voltage and timing diagrams from the circuit of FIG. 3.
Figure 6:
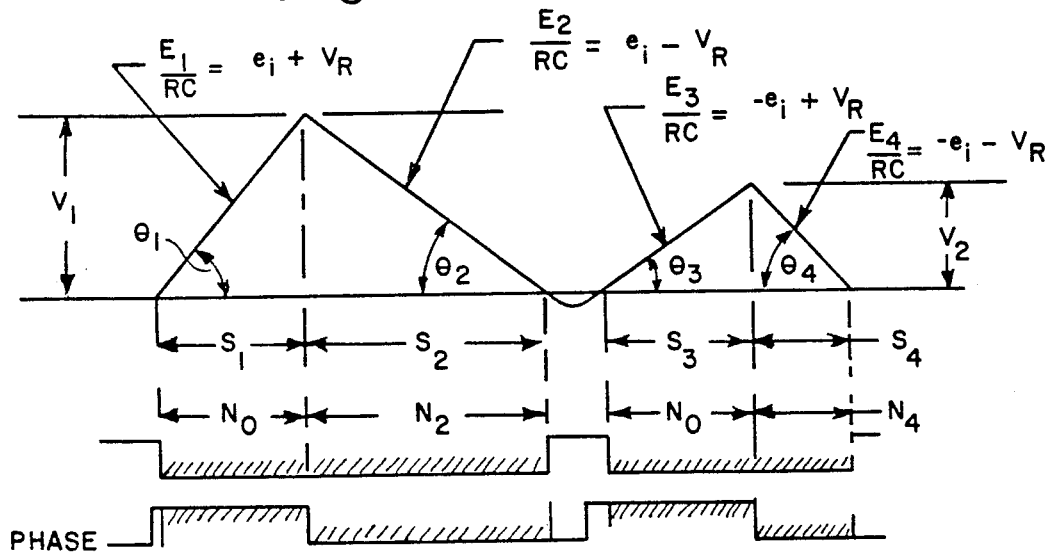
FIG. 6 is a series of voltage and timing diagrams for the circuit of FIG. 5.
Figure 8:
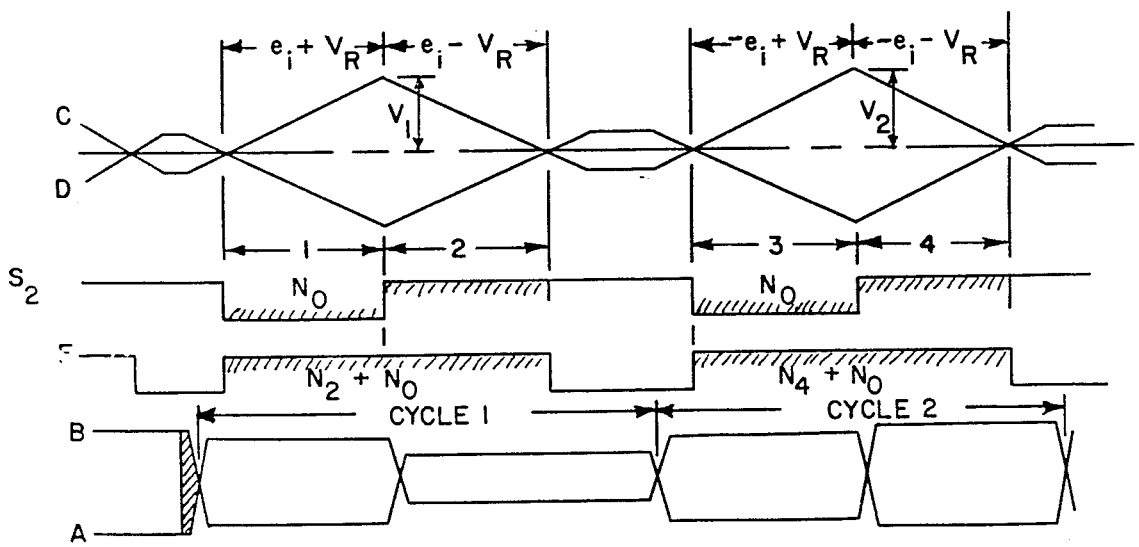
FIG. 8 is a series of voltage and timings for the circuit of FIG. 7.

These phases are the phases shown in FIGS. 4, 6 and 8.

Figure 3:
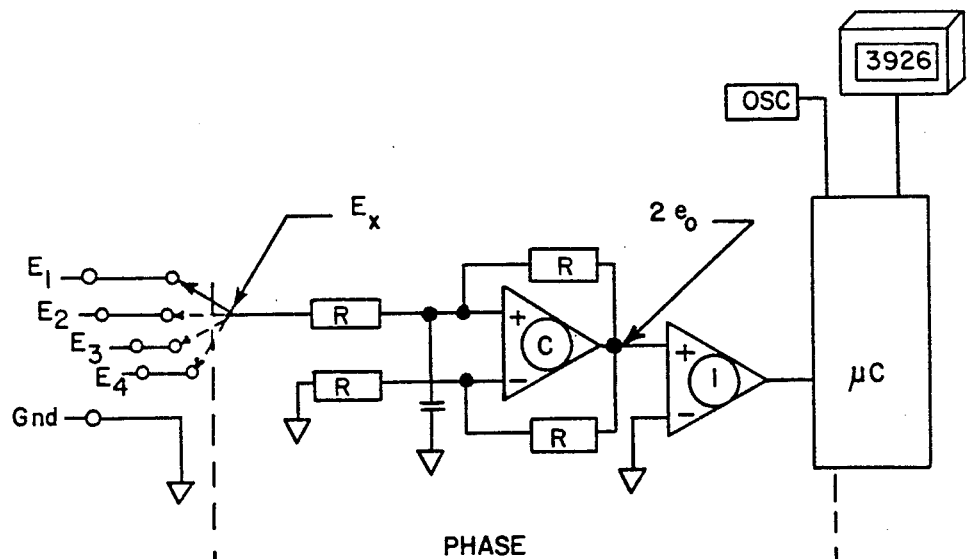
FIG. 3 is a circuit diagram partly in block form of a single-ended input positive integrator.

Referring now to FIGS. 3 and 4

Let: $E_1 = (e_i + V_R + V_t)$ $E_2 = (e_i - V_R + V_t)$ Where $V_R > (e_i + V_t)$ Then: $\frac{1}{N_1} = \frac{1}{N_0} = (e_i + V_R + V_t) \frac{1}{V_1 RCf}$ $\frac{1}{N_2} = (e_i - V_R + V_t) \frac{1}{(-V_1 RCf)}$ From the foregoing $$\frac{N_2 - N_0}{N_2 + N_0} = \frac{e_i + V_t}{V_R} \quad \text{(eq. 4)}$$

Defining a situation where there is no span drift.

A second conversion cycle with small $e_i$ inverted defines periods 3 and 4.

Let: $E_3 = (-e_i + V_R + V_t)$ and $E_4 = (-e_i - V_R + V_t)$

Then: $\frac{1}{N_o} = (-e_i + V_R + V_t) \frac{1}{V_2 RCf}$ where $V_R > (e_i + V_t)$ and $\frac{1}{N_4} = (-e_i - V_R + V_t) \frac{1}{(-V_2 RCf)}$ from this it can be derived that $$\frac{N_0 - N_4}{N_0 + N_4} = \frac{e_i - V_t}{V_R} \quad \text{(eq. 5)}$$

defining no span drift.

From the foregoing $V_t$ can be eliminated by adding equations 4 and 5 to derive $$\frac{N_2 - N_0}{N_2 + N_0} + \frac{N_0 - N_4}{N_0 + N_4} = \frac{2e_i}{V_R} \quad \text{(eq. 6)}$$

defining a situation involving no zero and no span drift.

Figure 5:
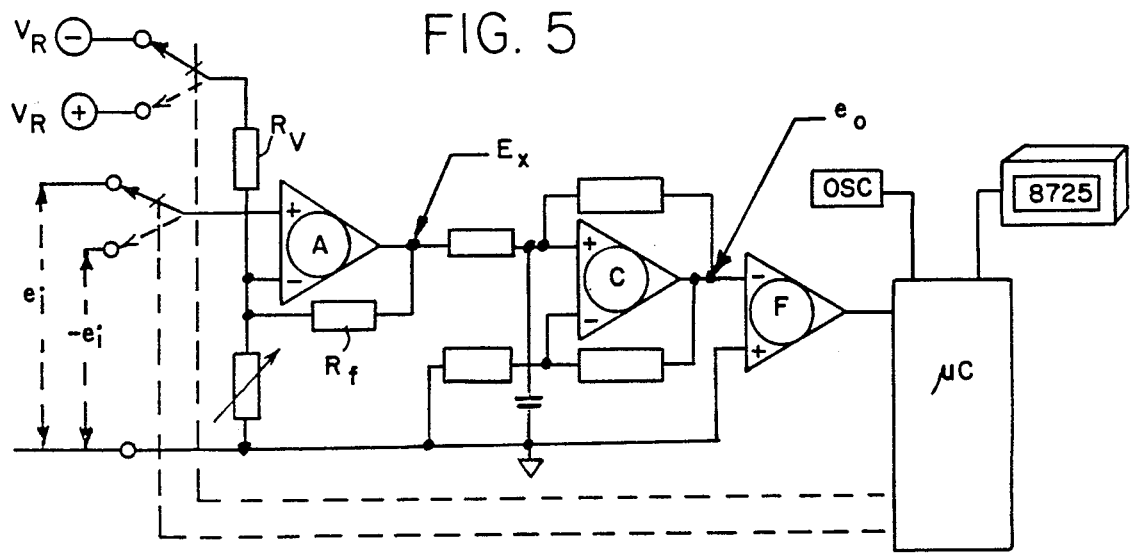
FIG. 5 is a circuit diagram extending the circuit of FIG. 4 by adding the pre-amplifier.

A gain factor $G_x$ can be included in equation 6 as follows:

$$\frac{N_2 - N_0}{N_2 + N_0} + \frac{N_0 - N_4}{N_0 + N_4} = \frac{2e_i G_i}{V_R} = k e_i \quad \text{(eq. 7)}$$

where $e_i G_i$ and $V_R$ are summed at the integrator as in FIG. 3.

$$\frac{N_2 - N_0}{N_2 + N_0} + \frac{N_0 - N_4}{N_0 + N_4} = \frac{2e_i G_i}{V_R G_R} = k e_i \quad \text{(eq. 8)}$$

where $e_i G_i$ and $V_R G_R$ are summed at the preamplifier as in FIG. 5.

The voltage and timing diagrams of FIGS. 4 and 6, corresponding to the circuits of FIGS. 3 and 5, respectively, illustrate the four phases previously mentioned, where phases 1 and 3, involving the slopes $$\frac{E_1}{RC} \text{ and } \frac{E_3}{RC}$$

have a fixed time period, $N_0$, and the second and fourth phases, involving the slopes $$\frac{-E_2}{RC} \text{ and } \frac{-E_4}{RC}$$

have time periods depending upon their slope to return to the zero level or crossover. The second diagram in FIGS. 4 and 6 illustrate $N_0$, $N_2$, $N_0$ and $N_4$ during the four respective phases, which counts are used in the foregoing equations.

Figure 7:
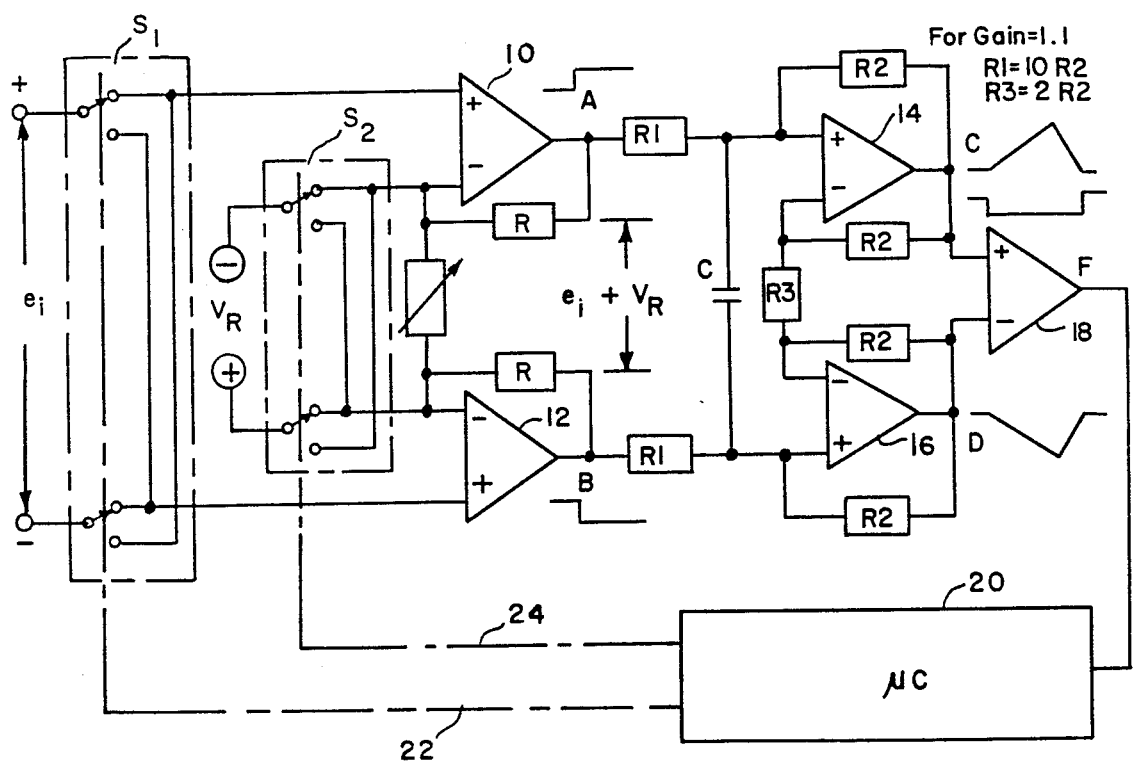
FIG. 7 is a circuit diagram partly in block form of the complete circuit employing the subject invention in differential form.
Figure 7A:
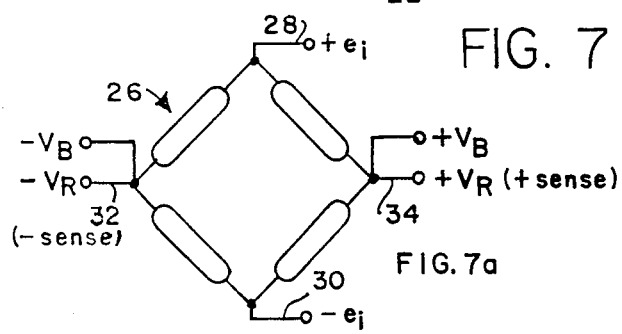
FIG. 7a is a circuit diagram of a bridge which may be employed to provide an analog input to the circuit of FIG. 7.

The overall differential circuit is shown in FIG. 7 with its voltage and timing diagrams illustrated in FIG. 8. The switch $S_1$ is used to switch $e_i$ in polarity across the positive inputs of the summing amplifiers, which includes operational amplifier 10 and 12. The analog signal $e_i$ may be derived from diagonally opposite points of a bridge circuit 26 on leads 28 and 30, as shown in FIG. 7a. The other diagonals of the bridge connect to power leads 32 and 34 which are connected to $-V_R$ and $+V_R$, respectively. As an example, the bridge could constitute a strain gauge on a load cell so that changes of the loading of the cell will be reflected in changes in the analog input signal $e_i$, and the resulting output is recorded in a ratio of volts per volt.

The switch $S_2$ is used to switch the reference voltage polarity back and forth between the negative input terminals of operational amplifiers 10 and 12. The output of operational amplifiers 10 and 12 is then $e_i + V_R$ and is connected through resistors $R_1$ to the positive inputs of the positive differential integrator, employing operational amplifiers 14 and 16. Resistors $R_2$ are connected from the input positive terminal to the output, and from the input to the negative terminal on both operational amplifiers 14 and 16. A resistor $R_3$ is connected between the negative input terminals of amplifiers 14 and 16 and the outputs of amplifiers 14 and 16 are connected to the positive and negative input terminals of crossover detector 18. Connected in this manner, the positive differential integrator floats. Referring to the first line of FIG. 8, the zero or crossover is shown as a straight line. If there were changes, these lines would go up and down, so the crossover would still occur at the same time. The floating relationship illustrates the capability of the positive differential integrator to eliminate noise and short-term drift. In a practical application, the resistors $R_1$ equal approximately 10 times the resistors $R_2$, and the resistor $R_3$ equals approximately 2 times the resistor $R_2$. The output of the crossover detector is connected to the microprocessor 20 which is also connected over lines 22 and 24 to activate switches $S_1$ and $S_2$, respectively, at their appropriate times, in order to derive the counts $N_0$, $N_2$ and $N_4$, as illustrated in the second and third lines of the diagram of FIG. 8.

It will be obvious to those skilled in the art that negative integrators such as shown in U.S. Pat. No. 4,390,864 may be used either as shown or in differential configuration. It will also be evident that the present invention has provided a greatly improved analog to digital convertor, wherein various problems associated with prior art, dual slope type, A-D convertors, have been eliminated, and other problems substantially reduced.

What is claimed is:

1. A method of converting an analog signal to a numerical count $N_x$ directly proportional to said analog signal without zero drift by utilizing equal and opposite reference voltages, where x is a numerical subscript 0, 2 or 4 used to designate specific counts of value N, and where N may have any count value achieved in separate periods, including effecting a first conversion in accordance with the following steps:

(a) applying said analog signal voltage and a first reference voltage over a first constant integration period starting at a zero level to an integrator,
(b) reversing said reference voltage and applying it and said analog signal voltage to said integrator over a unknown period until the zero level is intercepted,
(c) applying said analog signal voltage reversed and said first reference voltage to said integrator over said first constant integration period,
(d) applying said analog signal voltage reversed and said reversed reference voltage to said integrator over an unknown period until the zero level is again intercepted,
(e) generating a series of constant frequency clock pulses,
(f) providing a counter of said clock pulses,
(g) starting and stopping said counter with signals representing the starting and stopping of the two said constant and two said unknown time periods to generate numerical counts $N_0$, $N_2$, $N_0$, and $N_4$, and
(h) dividing $N_2 - N_0$ by $N_2 + N_0$ to obtain a signal proportional to said analog voltage and having no span drift.

2. The method of claim 1 in which instead of dividing $N_2 - N_0$ by $N_2 + N_0$, you divide $N_0 - N_4$ by $N_0 + N_4$ to obtain a signal proportional to said analog voltage and having n span drift.

3. The method of claim 1 in which in addition to dividing $N_2 - N_0$ by $N_2 + N_0$, there is a further step of dividing $N_0 - N_4$ by $N_0 + N_4$ to obtain a proportional signal, and adding the proportional signals to provide a signal in accordance with the following equation:

$$\frac{N_2 - N_0}{N_2 + N_0} + \frac{N_0 - N_4}{N_0 + N_4} = \frac{2e_i}{V_R}$$

which is a signal proportional to said analog voltage and having no span and no zero drift.

4. The method of claim 3 wherein said steps of applying said analog signal voltage and said first reference voltage include the step of applying said analog signal voltage and said first reference voltage to a positive integrator.

5. The method of claim 3 wherein said steps of applying said analog signal voltage and said first reference voltage include a step of first passing the said analog signal and said first reference voltage through a differential summing amplifier through which said analog signal voltage and said first reference voltage are applied.

6. The method of claim 5 wherein said steps of applying said analog signal voltage and said first reference voltage include the step of applying said analog signal voltage and said first reference voltage to a positive differential integrator.

7. A system for converting an analog signal numerical digital count directly proportional to said analog signal without zero drift, including in combination:

(a) a differential operational amplifier means including two operational amplifiers having positive and negative input terminals,
(b) a source of reference voltage connected across said differential operational amplifier means at said negative input terminals, (c) a first reversing switch connected to reverse the polarity of said source of reference voltage to said negative input terminals of said operational amplifier means, (d) a second reversing switch connected to pass said analog signal to said positive input terminals of said differential operational amplifier means, such that the analog signal is added to the reference voltage when said switch is in the first position and subtracted when in the second, (e) a positive differential integrator employing two operational amplifiers having a capacitor connected across their positive input terminals and a resistor across their negative input terminals and having resistors connected from the positive terminal of each amplifier to the output, and from the negative terminal of each amplifier to the output, the outputs of the differential integrator being connected to a crossover detector, and the output of the summing amplifier being connected through resistors to the two positive terminals of the positive differential integrator, (f) an oscillator for generating a series of clock pulses, (g) means for affecting a first conversion including a counter means for said clock pulses connected to said crossover detector and to said first reversing switch and arranged to receive said first start and stop signals from said crossover detector for providing a first numerical count of $N_0$ pulses over a fixed time period when said first reversing switch is in a first position, and said reference voltage being subtracted from said analog voltage when said first reversing switch is in a second position for providing two second start and stop signals from said crossover detector when the output voltage of the positive differential integrator crosses over, said second start and stop signals starting and stopping said counter to provide a second numerical count of $N_2$ pulses, and (h) means for dividing a count difference $N_2 - N_0$ by a sum of counts $N_2 + N_0$ to obtain a signal proportional to said analog voltage and having no span drift.

8. The system of claim 7 in which said positive differential integrator is replaced by a negative differential integrator.

9. The system of claim 7 in which said analog signal is obtained from a strain gauge bridge circuit having one diagonal connecting across said source of reference voltage and another diagonal connected to provide said analog signal.

10. The system of claim 8 in which said analog signal is obtained from a strain gauge bridge circuit having one diagonal connecting across said source of reference voltage and another diagonal connected to provide said analog signal.

11. A system according to claim 7 including a means for providing a second conversion, said means placing said reference voltage switch in its first position, and reversing the polarity of the switch passing said analog signal, then switching said first reversing switch to its second position after said fixed time period, resulting in said reference voltage being subtracted from said analog voltage to provide two third start and stop signals from said differential operational amplifier and crossover detector means, and means placing said first reversing switch in its first position for said fixed time period and then in its second position resulting in fourth stop and start signals from said crossover detector as its output voltage crosses over, said fourth stop and start signals stopping and starting said counter to provide a fourth numerical count of $N_4$ pulses, and means for dividing $N_0 - N_4$ by $N_0 + N_4$ to provide a numerical count proportional to said analog voltage and having no span drift.

12. Apparatus of claims 7 or 8 including means to add their outputs to derive $$\frac{N_2 - N_0}{N_2 + N_0} + \frac{N_0 - N_4}{N_0 + N_4} = \frac{2e_i}{V_R}$$

which is a signal proportional to said analog voltage and having no span and no zero drift.

13. A positive differential integrator including two differential amplifiers, each having an input signal resistively coupled to its positive input and a capacitor coupled across the positive inputs, a resistor coupled across the negative inputs and a resistor coupled from the output to the positive inputs and from the output to the negative input of each amplifier, whereby, there being no connection to ground, noise tends to be eliminated.

* * * * *